(12) United States Patent
Siddique et al.

(10) Patent No.: US 11,962,886 B2
(45) Date of Patent: Apr. 16, 2024

(54) FOLDED OPTIC FOR MULTICAMERA DEVICE AND MULTICAMERA DEVICE INCLUDING THE SAME

(71) Applicant: Samsung Electronics Co., Ltd., Suwon-si (KR)

(72) Inventors: Radwanul Hasan Siddique, Monrovia, CA (US); Mahdad Mansouree, Amherst, MA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

(21) Appl. No.: 18/143,434

(22) Filed: May 4, 2023

(65) Prior Publication Data

US 2023/0276114 A1 Aug. 31, 2023

Related U.S. Application Data

(63) Continuation of application No. 17/401,169, filed on Aug. 12, 2021, now Pat. No. 11,683,573.
(Continued)

(51) Int. Cl.
*H04N 23/55* (2023.01)
*G03B 17/17* (2021.01)
(Continued)

(52) U.S. Cl.
CPC ............. *H04N 23/55* (2023.01); *G03B 17/17* (2013.01); *H01L 27/14625* (2013.01);
(Continued)

(58) Field of Classification Search
CPC ........ H04N 23/55; H04N 23/45; H04N 23/50; H05B 47/11; H05B 45/12; G03B 17/17;
(Continued)

(56) References Cited

U.S. PATENT DOCUMENTS 8,779,483 B2 7/2014 Salsman et al.
9,838,601 B2 12/2017 Georgiev et al.
(Continued)

FOREIGN PATENT DOCUMENTS

CN 110690238 A 1/2020
CN 111258059 A 6/2020
(Continued)

OTHER PUBLICATIONS

Tremblay, Eric J., et al., "Ultrathin cameras using annular folded optics," Applied Optics, Feb. 2007, vol. 46, No. 4, pp. 463-471.

*Primary Examiner* — Bao Q Truong
(74) *Attorney, Agent, or Firm* — Lewis Roca Rothgerber Christie LLP

(57) ABSTRACT

A multicamera device includes: a first sensor to detect a first spectrum of external light; a second sensor to detect a second spectrum of the external light; and an optic overlapping with the first and second sensors. The optic includes: a substrate; a first reflective layer on the substrate; and an optical layer between the first sensor and the substrate, the optical layer to transmit the first spectrum of the external light to the first sensor, and reflect the second spectrum of the external light toward the first reflective layer, and the first reflective layer is to reflect the second spectrum of the external light in a direction toward the second sensor.

20 Claims, 8 Drawing Sheets

Related U.S. Application Data

(60) Provisional application No. 63/215,765, filed on Jun. 28, 2021, provisional application No. 63/073,927, filed on Sep. 2, 2020.

(51) Int. Cl.
  *H01L 27/146* (2006.01)
  *H01L 31/0232* (2014.01)
  *H04N 23/45* (2023.01)
  *H05B 45/12* (2020.01)
  *H05B 47/11* (2020.01)

(52) U.S. Cl.
  CPC .. *H01L 27/14685* (2013.01); *H01L 31/02327* (2013.01); *H04N 23/45* (2023.01); *H05B 45/12* (2020.01); *H05B 47/11* (2020.01)

(58) Field of Classification Search
  CPC ......... H01L 27/14625; H01L 27/14685; H01L 31/02327; F21V 5/00; F21V 7/00; F21V 7/0008; F21V 7/0016; F21V 23/00; F21V 23/0442; F21V 23/0464; F21V 2200/00; F21V 2200/20
  See application file for complete search history.

(56) References Cited

U.S. PATENT DOCUMENTS

| | | |
|---|---|---|
| 10,440,244 B2 | 10/2019 | Rosenblatt et al. |
| 10,446,700 B2 | 10/2019 | Wang et al. |
| 10,488,584 B2 | 11/2019 | Karafin et al. |
| 10,514,256 B1 | 12/2019 | Kamarshi et al. |
| 10,578,869 B2 | 3/2020 | Osterhout et al. |
| 10,700,225 B2 | 6/2020 | Wang et al. |
| 10,795,168 B2 | 10/2020 | Riley, Jr. et al. |
| 11,683,573 B2 * | 6/2023 | Siddique ................ G03B 19/22 348/165 |
| 2004/0119869 A1 * | 6/2004 | Tretter ................... H04N 23/54 348/335 |
| 2018/0096186 A1 * | 4/2018 | Mienko ............... G06V 40/1359 |
| 2020/0321378 A1 | 10/2020 | Paiella et al. |
| 2020/0400568 A1 | 12/2020 | Kabiri et al. |
| 2021/0112647 A1 | 4/2021 | Coleman |
| 2021/0152681 A1 | 5/2021 | Yoon et al. |
| 2021/0176412 A1 | 6/2021 | Yoon et al. |

FOREIGN PATENT DOCUMENTS

| | | |
|---|---|---|
| GB | 2585782 A | 1/2021 |
| KR | 10-1434716 B1 | 9/2014 |

* cited by examiner

FOLDED OPTIC FOR MULTICAMERA DEVICE AND MULTICAMERA DEVICE INCLUDING THE SAME

CROSS-REFERENCE TO RELATED APPLICATION(S)

This application is a continuation of U.S. patent application Ser. No. 17/401,169, filed on Aug. 12, 2021, which claims priority to and the benefit of U.S. Provisional Application No. 63/215,765, filed on Jun. 28, 2021, entitled "FOLDED COMPACT OPTICS FOR ON-CHIP MULTI-CAMERA," and claims priority to and the benefit of U.S. Provisional Application No. 63/073,927, filed on Sep. 2, 2020, entitled "FOLDED COMPACT OPTICS FOR ON-CHIP MULTI-CAMERA.", the entire content of all of which are incorporated by reference herein.

BACKGROUND

1. Field

Aspects of one or more embodiments of the present disclosure relate to a multicamera device, and more particularly, to a folded optic for a multicamera device and a multicamera device including the folded optic.

2. Description of Related Art

Recently, the number of cameras included in imaging and sensing systems has increased in order to provide improved picture quality, zoom functionality, light sensitivity, depth perception, and/or the like. These cameras may have different field of views (FOVs) from each other such that data from the different cameras may be post-processed and combined with each other to generate a single photo or image. In this case, however, physical alignment complexity of the cameras, callibration and alignment complexity of the data from the different FOVs, and input/output (IO) power consumption may be increased.

Moreover, as the number of cameras are being increased, the aesthetics of the multicamera devices may be reduced. For example, because each camera may receive external light through a separate lens that is externally exposed, the cameras may be individually recognizable by a user. Thus, more of the surface area of the multicamera devices may be devoted to accommodate the externally exposed lenses.

The above information disclosed in this Background section is for enhancement of understanding of the background of the present disclosure, and therefore, it may contain information that does not constitute prior art.

SUMMARY

One or more embodiments of the present disclosure are directed to a folded optic for a multicamera device, and a multicamera device including the folded optic.

According to one or more embodiments of the present disclosure, a multicamera device includes: a first sensor configured to detect a first spectrum of external light; a second sensor configured to detect a second spectrum of the external light; and an optic overlapping with the first and second sensors, and including: a substrate; a first reflective layer on the substrate; and an optical layer between the first sensor and the substrate, the optical layer being configured to transmit the first spectrum of the external light to the first sensor, and reflect the second spectrum of the external light toward the first reflective layer. The first reflective layer is configured to reflect the second spectrum of the external light in a direction toward the second sensor.

In some embodiments, the optic may further include a first metastructure at a region of the substrate overlapping with the second sensor, and configured to collimate the second spectrum of the external light on the second sensor.

In some embodiments, the first reflective layer may be inclined to reflect the second spectrum toward the first metastructure.

In some embodiments, the optic may further include a second metastructure at the first reflective layer, and configured to collimate the second spectrum onto the first metastructure.

In some embodiments, the device may further include a third sensor configured to detect a third spectrum of the external light. The optical layer may be configured to further reflect the third spectrum of the external light toward the first reflective layer, and the optical layer may further include a third metastructure at a region of the substrate overlapping with the third sensor, and configured to collimate the third spectrum of the external light on the third sensor. The second metastructure may be configured to collimate the second spectrum of the external light reflected by the optical layer in a direction toward the first metastructure, and to collimate the third spectrum of the external light reflected by the optical layer in a different direction toward the third metastructure.

In some embodiments, the optic may further include a second reflective layer on the substrate; the first reflective layer may be configured to reflect the second spectrum toward an end of the optical layer; the end of the optical layer may be configured to reflect the second spectrum toward the second reflective layer; and the second reflective layer may be configured to reflect the second spectrum toward the first metastructure.

In some embodiments, the second reflective layer may be offset from the first metastructure, and located between the optical layer and the first metastructure in a plan view.

In some embodiments, the second reflective layer may overlap with the first metastructure, and the optic may further include a fourth metastructure at the second reflective layer configured to collimate the second spectrum on the first metastructure.

In some embodiments, the device may further include: a lens on the optic, and configured to transmit the external light through, and focus the external light on the first sensor through the optic; and an absorption layer on the first reflective layer, and configured to reduce a reflectance of a surface of the first reflective layer facing the lens.

According to one or more embodiments of the present disclosure, an optic for a multicamera device including a first sensor configured to detect a first spectrum of external light, and a second sensor configured to detect a second spectrum of the external light, includes: a substrate; a first reflective layer on the substrate; and an optical layer between the first sensor and the substrate, the optical layer being configured to transmit the first spectrum of the external light to the first sensor, and reflect the second spectrum of the external light toward the first reflective layer. The first reflective layer is configured to reflect the second spectrum of the external light in a direction toward the second sensor.

In some embodiments, the optic may further include a first metastructure at a region of the substrate overlapping with the second sensor, and configured to collimate the second spectrum of the external light on the second sensor.

In some embodiments, the first reflective layer may be inclined to reflect the second spectrum toward the first metastructure.

In some embodiments, the optic may further include a second metastructure at the first reflective layer, and configured to collimate the second spectrum onto the first metastructure.

In some embodiments, the optical layer may be configured to further reflect a third spectrum of the external light toward the first reflective layer, the third spectrum being detectable by a third sensor of the multicamera device, the optical layer may further include a third metastructure at a region of the substrate overlapping with the third sensor, and configured to collimate the third spectrum of the external light on the third sensor, and the second metastructure may be configured to collimate the second spectrum of the external light reflected by the optical layer in a direction toward the first metastructure, and to collimate the third spectrum of the external light reflected by the optical layer in a different direction toward the third metastructure.

In some embodiments, the optic may further include a second reflective layer on the substrate. The first reflective layer may be configured to reflect the second spectrum toward an end of the optical layer; the end of the optical layer may be configured to reflect the second spectrum toward the second reflective layer; and the second reflective layer may be configured to reflect the second spectrum toward the first metastructure.

In some embodiments, the second reflective layer may be offset from the first metastructure, and located between the optical layer and the first metastructure in a plan view.

In some embodiments, the second reflective layer may overlap with the first metastructure, and the optic may further include a fourth metastructure at the second reflective layer configured to collimate the second spectrum on the first metastructure.

In some embodiments, the first reflective layer and the optical layer may overlap with each other, and the first metastructure may be spaced apart from the optical layer at a same surface of the substrate as that of the optical layer.

According to one or more embodiments of the present disclosure, a multicamera device includes: a first sensor configured to detect a first spectrum of external light; a second sensor configured to detect a second spectrum of the external light, and located along a first direction with respect to the first sensor; a lens overlapping with the first sensor, and defining a first optical path for the external light toward the first sensor in a second direction crossing the first direction; and an optic between the lens and the first and second sensors, and defining a second optical path for the second spectrum of the external light towards the second sensor in the first direction. The optic includes: a substrate; a reflective layer on a first surface of the substrate; and an optical layer on a second surface of the substrate opposite the first surface, and configured to transmit the first spectrum of the external light to the first sensor, and reflect the second spectrum of the external light towards the reflective layer.

In some embodiments, the optic may further include a first metastructure at a region of the substrate overlapping with the second sensor, and configured to collimate the second spectrum of the external light on the second sensor, and the reflective layer may be configured to reflect the second spectrum of the external light reflected by the optical layer toward the first metastructure along the second optical path.

In some embodiments, the reflective layer and the optical layer may overlap with each other within the first optical path of the external light.

In some embodiments, the reflective layer may be between the optical layer and the second sensor in a plan view, and the optical layer may be inclined to reflect the second spectrum of the external light towards the reflective layer.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
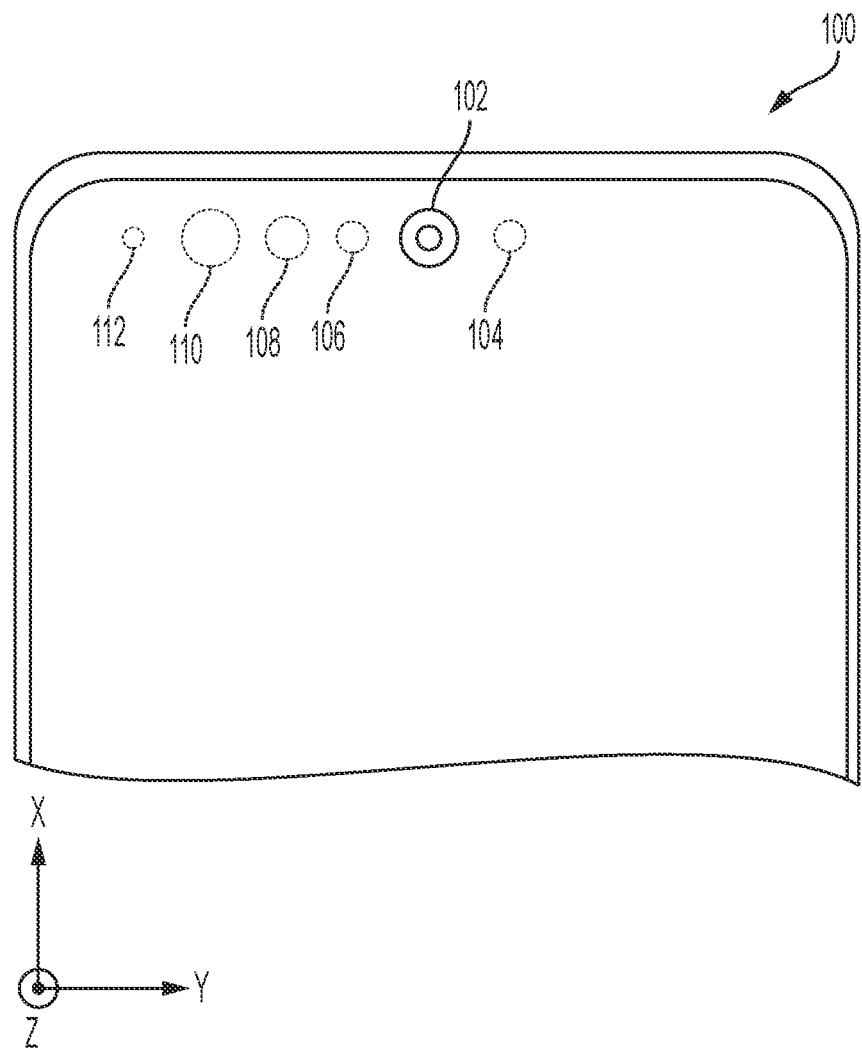
FIG. 1 illustrates a partial plan view of a front surface of a multicamera device according to one or more embodiments of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Generally, a lens of a camera may transmit and focus external light on an image sensor (e.g., a camera sensor) located at a focal distance (e.g., a focal point) of the lens, such that the image sensor may generate image data for generating an image according to the external light detected by the image sensor. Such image sensors may include, for example, charge-coupled device (CCD) sensors, Complementary Metal-Oxide-Semiconductor (CMOS) image sensors, various infrared (IR) sensors (e.g., thermal sensors and the like), time of flight (TOF) sensors, single-photon avalanche diode (SPAD) sensors, avalanche photodiode (APD) sensors, nanowire detector (ND) or nanowire single-photon detector (NSPD) sensors, Quantum dot (QD) sensors, multispectral sensors and/or the like, which may detect and use various different spectrums of light to generate an image.

For example, some image sensors (e.g., CMOS sensors) may detect the visible region (e.g., the visible spectrum) of the electromagnetic spectrum, and various different IR sensors (e.g., thermal sensors, SPAD sensors, APD sensors, ND/QD sensors, and the like) may detect various different bands in the IR region (e.g., the IR spectrum) of the electromagnetic spectrum. The visible region of the electromagnetic spectrum includes a violet band (e.g., about 380-450 nanometers (nm)), a blue band (e.g., about 450-485 nm), a cyan band (e.g., about 485-500 nm), a green band (e.g., about 500-565 nm), a yellow band (e.g., about 565-590 nm), an orange band (e.g., about 590-625 nm), and a red band (e.g., about 625-740 nm) of the visible spectrum. The IR region of the electromagnetic spectrum may be between the visible region and the microwave region, and may extend from a nominal red edge of the visible region of about 0.7 micro-meters (µm) to a nominal edge of the microwave region of about 1 milli-meter (mm). For example, the IR spectrum includes a near-infrared (NIR) band ranging from about 0.7 µm to about 1.4 µm, a short-wavelength infrared (SWIR) band ranging from about 1.4 µm to about 3 µm, a mid-wavelength infrared (MWIR) band ranging from about 3 µm to about 8 µm, a long-wavelength infrared (LWIR) band ranging from about 8 µm to about 15 µm, and a far infrared (FIR) band ranging from about 15 µm to about 1 mm.

By combining image data from various different image sensors that detect different spectrums of the external light, the resulting image may be improved over any one image generated by any one image sensor. For example, a visible image may be combined with an IR image, for example, such as a thermal image, to enhance the resulting image in low lighting conditions. As another example, the cameras may have different functionalities, for example, such as dot projectors, face detection, optical zoom, and/or the like, to enhance the functionalities to the multicamera device. Accordingly, the number of various different types of images sensors (e.g., camera sensors) are being increased in multicamera devices to enhance the generated images and/or to provide enhanced functionality. In this case, however, the number of lenses that may be externally exposed may be increased, resulting in reduced aesthetics, and the image sensors may have different FOVs from each other, resulting in increased processing complexity and power consumption.

According to one or more embodiments of the present disclosure, a folded optic may be provided between a lens (e.g., a main lens or a global lens) and two or more image sensors, such that the two or more image sensors may receive external light from the same lens, and thus, may have the same or substantially the same FOV as each other. Accordingly, power consumption may be reduced while improving the aesthetics of the multicamera device by reducing the number of externally exposed lenses. Further, a main optical path of the external light may be provided by the lens through the folded optic to one of the image sensors, while one or more secondary optical paths of the external light may be provided by the folded optic in a lateral direction (e.g., a y-direction or x-direction) to other image sensors. Thus, a track length (e.g., the distance from an image sensor to a front (or top) of a global lens) may be reduced (e.g., in a z-direction), while increasing a length of the secondary optical paths in the lateral direction (e.g., the y-direction or x-direction). Accordingly, a thickness (e.g., in the z-direction) of the multicamera device may be reduced.

Figure 2:
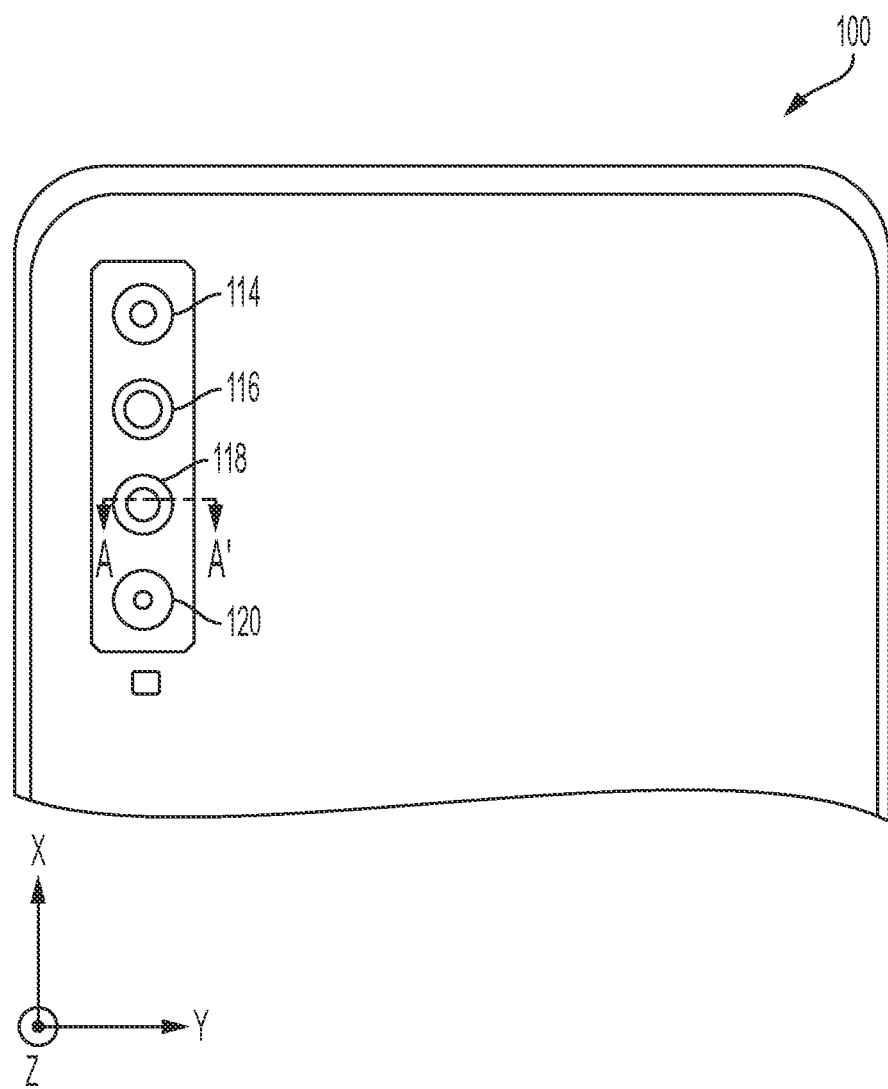
FIG. 2 illustrates a partial plan view of a rear surface of a multicamera device according to one or more embodiments of the present disclosure.

FIG. 1 illustrates a partial plan view of a front surface of a multicamera device according to one or more embodiments of the present disclosure. FIG. 2 illustrates a partial plan view of a rear surface of a multicamera device according to one or more embodiments of the present disclosure.

According to one or more embodiments, a multicamera device may be implemented as (or included in) a portable electronic device, for example, such as a smartphone, smart glasses or other wearable device, a tablet, a laptop, and/or the like. However, the present disclosure is not limited thereto, and the multicamera device may be included in any suitable electronic device, for example, such as a television, a monitor, a personal computer, a digital camera, Internet-of-things (IoT) devices, drones, augmented reality and virtual reality (AR/VR) devices, machine/computer vision sensors and/or the like. For convenience of illustration, FIGS. 1 and 2 show an example of a smartphone as a multicamera device 100, but the present disclosure is not limited thereto.

As shown in FIGS. 1 and 2, the multicamera device 100 may include various surfaces, each including multiple image sensors (e.g., cameras) and/or other sensors. For example, a front surface of the multicamera device 100 as shown in FIG. 1 may include a front camera 102, an iris sensor 104 for detecting NIR light emitted from an iris sensor emitter 110, a proximity sensor emitter 106, a proximity sensor and light sensor detector 108, an SVC LED 112, and/or the like. A rear surface of the multicamera device 100 as shown in FIG. 2 may include an ultra-wide camera 114, a telephoto camera 116, a main camera 118, a depth camera 120, and/or the like. As shown in FIGS. 1 and 2, each of the cameras 102, 114, 116, 118, and 120 may include an externally exposed lens to provide external light to its corresponding image sensor. Thus, as the number of cameras included in the multicamera device 100 are further increased, such that each camera (e.g., each image sensor) uses its own externally exposed lens, the aesthetics of the multicamera device 100 may be decreased.

According to one or more embodiments of the present disclosure, as described in more detail below with reference to FIGS. 3-7, at least some of the cameras (e.g., at least some of the image sensors) of the multicamera device 100 may share the same lens such that at least one camera (e.g., at least one image sensor) of the cameras sharing the same lens may be hidden, and thus, the number of cameras may be increased without increasing the number of externally exposed lenses.

Figure 3:
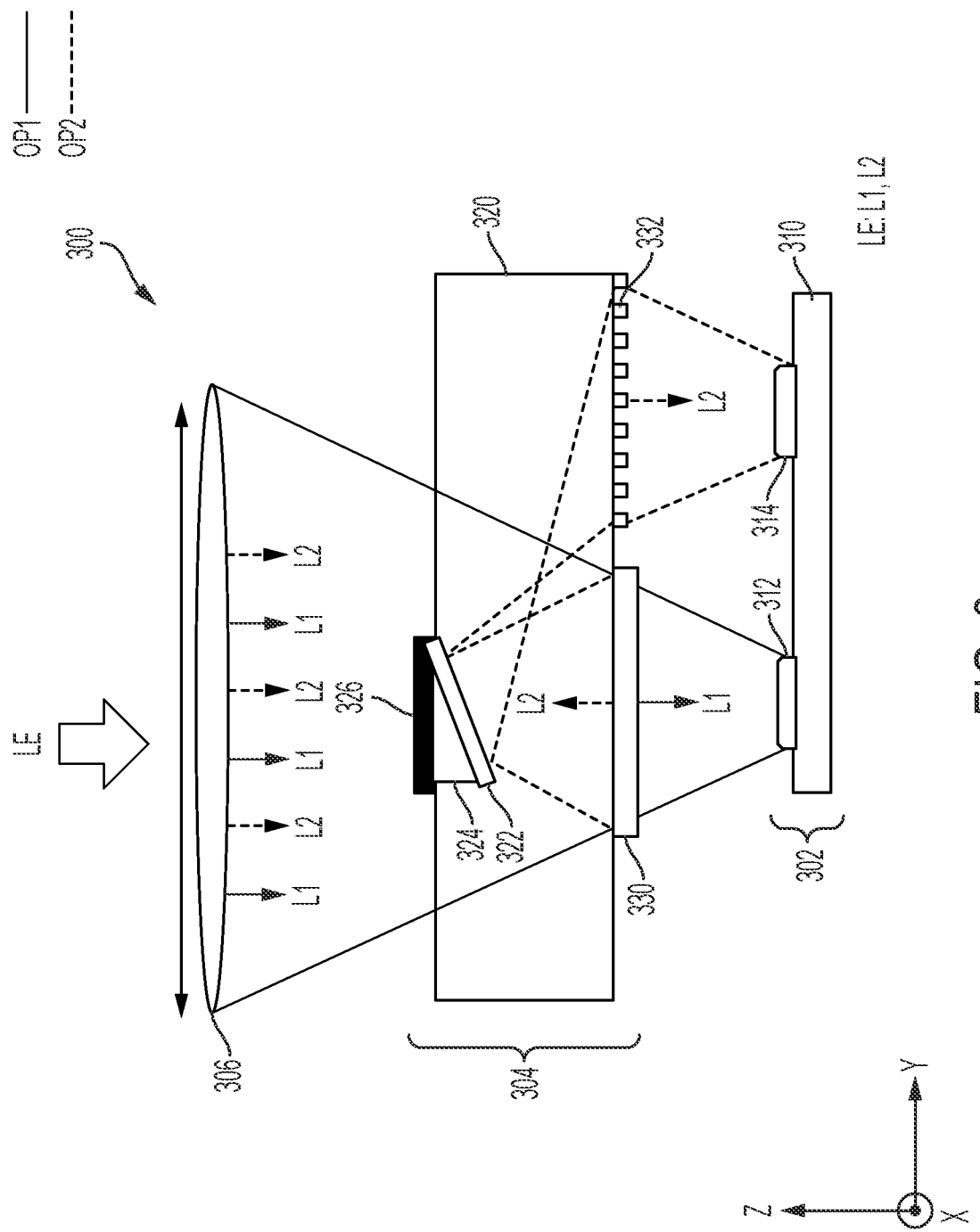
FIG. 3 illustrates a schematic cross-sectional view of a multicamera device according to one or more embodiments of the present disclosure.

FIG. 3 illustrates a schematic cross-sectional view of a multicamera device according to one or more embodiments of the present disclosure. For example, FIG. 3 may illustrate an exploded schematic cross-sectional view taken along the line A-A' of FIG. 2.

According to one or more embodiments of the present disclosure, a multicamera device 300 may include a folded optic 304 and a main lens (e.g., a global lens) 306 to provide a plurality of optical paths OP1 and OP2 for various target spectrums (e.g., L1 and L2) of external light LE. For example, a first optical path OP1 (e.g., shown as solid lines) may be a primary optical path for a first target spectrum L1 of the external light LE, and a second optical path OP2 (e.g., shown as dashed lines) may be a secondary optical path for a second target spectrum L2 of the external light LE. As an example, the first target spectrum L1 may include the visible region of the electromagnetic spectrum, and the second target spectrum L2 may include at least a portion of the IR region of the electromagnetic spectrum, for example, such as the NIR band of the IR spectrum, but the present disclosure is not limited thereto. In other embodiments, the first and second target spectrums L1 and L2 may include any suitable bands of the electromagnetic spectrum that are different from each other. Thus, the first and second target spectrums L1 and L2 of the external light LE may be directed onto various different sensing regions of a sensor chip 302 through the first and second optical paths OP1 and OP2, respectively.

The sensing regions of the sensor chip 302 may include a first image sensor (e.g., a first camera sensor) 312 and a second image sensor (e.g., a second camera sensor) 314 that are spaced apart from each other on a sensor substrate 310. The sensor substrate 310 may include, for example, a printed circuit board (PCB), a flexible printed circuit board (FPCB), readout integrated circuit (ROIC), or any other suitable chip substrate. The first image sensor 312 may include, for example, a first type of sensor (e.g., a CMOS sensor) including a plurality of first pixels (e.g., an RGB pixel array) to detect the first target spectrum L1 of the external light LE in order to generate a first image. The second image sensor 314 may include, for example, a second type of sensor including a plurality of second pixels (e.g., a SPAD/APD array) to detect the second target spectrum L2 of the external light LE in order to generate a second image. However, the present disclosure is not limited thereto, and the first and second image sensors 312 and 314 may include any suitable types of image sensors to detect the different target spectrums L1 and L2 of the external light LE.

As shown in FIG. 3, the first image sensor 312 may be located at a focal distance (e.g., a focal point) of the lens 306, and the second image sensor 314 may be offset from the focal distance, but located at (e.g., in or on) a same plane (e.g., a same surface of the sensor substrate 310) as that of the first image sensor 312. The lens 306 may include any suitable material, for example, such as glass, plastic, and/or the like, to transmit the external light LE through including the first target spectrum L1 and the second target spectrum L2, and may be shaped (e.g., a concave shape or a convex shape) to focus the external light LE at the focal distance. However, the present disclosure is not limited thereto, and the material of the lens 306 may include any suitable materials according to the target spectrums of the first and second target spectrums L1 and L2, such that the lens 306 may transmit the first target spectrum L1 and the second target spectrum L2 of the external light LE through. Accordingly, the lens 306 may define the first optical path OP1 by focusing the external light LE through the optic 304 toward the first image sensor 312.

The optic 304 may transmit at least the first target spectrum L1 of the external light through to the first image sensor 312, and may reflect the second target spectrum L2 of the external light LE in an offset direction (e.g., the y-direction or the x-direction) toward the second image sensor 314 to collimate (e.g., to focus) the reflected second target spectrum L2 onto the second image sensor 314. Thus, the optic 304 may provide the second optical path OP2 for the second target spectrum L2 in the offset direction (e.g., in a lateral direction). As the optic 304 defines the second optical path OP2 of the second target spectrum L2 toward the second image sensor 314 in the offset direction, a length of the second optical path OP2 may be increased in the offset direction, while the track length (e.g., the distance between the image sensor and a top surface of the lens 306 in the z-direction) may be decreased. Accordingly, the thickness (e.g., in the z-direction) of the multicamera device 300 may be reduced.

Further, as the first and second image sensors 312 and 314 receive the respective target spectrums L1 and L2 of the external light LE through the same lens 306, the number of lenses that are externally exposed and visually recognizable may be reduced, and the aesthetics of the multicamera device 300 may be improved. In a comparative example, the second image sensor 314 may receive the second target spectrum L2 of external light transmitted through a separate lens that is externally exposed, and thus, the number of lenses that are externally exposed and visually recognizable may be increased, which may affect the aesthetics of the multicamera device 300.

Moreover, according to one or more embodiments, because the external light LE is transmitted through the same lens 306, the first and second image sensors 312 and 314 may have the same or substantially the same FOV as each other. However, in some embodiments, the second image generated by the second image sensor 314 may be skewed (e.g., may have a keystone effect) according to a distance of the offset of the second image sensor 314 from the focal point of the lens 306. In this case, the skew of the second image may be easily corrected (or compensated for) using any suitable post-processing on- or off-chip techniques known to those skilled in the art, which may be more efficient than aligning and combining images with different FOVs from each other. Accordingly, processing power consumption may be improved (e.g., may be reduced).

In more detail, in some embodiments, the optic 304 may include a substrate 320, a reflective layer or member (e.g., a first reflective layer or member) 322 on the substrate 320, an absorption layer or member 326 on the reflective layer 322, an optical layer or member 330 between the first image sensor 312 and the substrate 320, and a metastructure or metasurface of nanostructures (e.g., a first metastructure) 332 between the second image sensor 314 and the substrate 320. The optical layer 330, the reflective layer 322, and the absorption layer 326 may be located in the first optical path OP1 to overlap with the first image sensor 312 (e.g., in the z-direction). The metastructure 332 may overlap with the second image sensor 314, and may be offset (e.g., in the y-direction or the x-direction) from the first optical path OP1. Thus, the metastructure 332 may be offset from (e.g., in the y-direction or the x-direction) or may not overlap with (e.g., in the z-direction) the optical layer 330, the reflective layer 322, and the absorption layer 326.

The substrate 320 may include any suitable transparent material for transmitting the external light LE including at least the first target spectrum L1 and the second target spectrum L2 through, for example, such as glass, plastics, silica, SiOx, $Si_xN_y$, $Si_xO_yN_z$, and/or the like. The substrate 320 may have a suitable thickness (e.g., in the z-direction) to enable the second target spectrum L2 to be reflected (e.g., by the reflective layer 322) in the offset direction toward the metastructure 332 to be collimated on the second image sensor 314. For example, the substrate 320 may have a thickness in the range of about 10-1000 ums, but the present disclosure is not limited thereto.

The absorption layer 326 may absorb, block, or reduce reflection (e.g., by the reflective layer 322) of the external light LE incident thereon to prevent or reduce scattering of the external light LE transmitted through the lens 306. For example, the absorption layer 326 may include tungsten, carbon (e.g., carbon black, carbon nanotubes, and/or the like) a black pigment, or multiple layers of metal-insulator-metal, whereas, metals may include aluminum, tungsten and insulators may include $SiO_x$, $Al_xO_y$, $Si_xO_yN_z$, $Si_xN_y$, and/or the like. The absorption layer 326 may overlap with a central area of the lens 306 (e.g., in the z-direction), and may be suitably sized according to a size of the lens 306, a focal length of the lens 306, and a distance between the lens 306 and the absorption layer 326, so as to not obstruct (e.g., not block) the external light LE. For example, for an ideal paraxial lens 306 with a focal distance of 10 mm and a diameter of 10 mm, an absorption layer centrally located at about 5 mm between the lens and its focal point and having a radius of about 1.6 mm may reduce the intensity of the external light LE by about 25% with no noticeable aberrations. However, at a radius of about 3.1 mm, the absorption layer may fully obstruct (e.g., may completely block) the external light LE from reaching the first image sensor 312, which is located at the focal point of the lens 306. Accordingly, as the size (e.g., a width or diameter) of the absorption layer 326 is increased, an intensity of the external light LE that may be incident on the first image sensor 312 may be reduced until the external light LE is blocked (e.g., at a center of the first image produced by the first image sensor 312) or completely blocked (e.g., such that a black image is produced by the first image sensor 312) when the absorption layer 326 is oversized. Accordingly, the absorption layer 326 may be suitably sized in order to enable enough of the external light LE to reach the first image sensor 312, such that a suitable first image may be generated. However, the present disclosure is not limited thereto, and in other embodiments, the absorption layer 326 may be omitted according to a material of the reflective layer 322.

The optical layer 330 may transmit the external light LE including at least the first target spectrum L1 through to the first image sensor 312, while reflecting the second target spectrum L2 (e.g., while reflecting only the second target spectrum L2) of the external light LE toward the reflective layer 322. For example, the optical layer 330 may include a dielectric mirror (e.g., a Bragg mirror or a Bragg reflector) or the like having a multi-layered structure of different dielectric materials with different refractive indices from one another to reflect the second target spectrum L2 of the external light LE while transmitting at least the first target spectrum L1 of the external light LE through. For example, in some embodiments, the dielectric materials may include different metal/semiconductor oxide or metal/semiconductor nitride coatings (e.g., $SiO_x$, $Al_xO_y$, $Ti_xO_y$, $Hf_xO_y$, $Si_xO_yN_z$, Si$_x$N$_y$, and/or the like). Accordingly, the first image sensor 312 may receive at least the first target spectrum L1 of the external light LE through the lens 306, the substrate 320, and the optical layer 330 to generate the first image, and the optical layer 330 may reflect the second target spectrum L2 of the external light LE toward the reflective layer 322 to be deflected toward the second image sensor 314 to generate the second image.

In some embodiments, the reflective layer 322 may deflect the second target spectrum L2 of the external light LE reflected from the optical layer 330 toward the metastructure 332. The reflective layer 322 may include a suitable reflective material to reflect the second target spectrum L2 of the external light. For example, in some embodiments, the reflective material may include a highly reflective metal material, such as aluminum, tin, nickel, platinum, copper, brass, gold, silver, or the like, or other suitable reflective materials or coatings (e.g., TiN), but the present disclosure is not limited thereto. As another example, in some embodiments, the reflective layer 322 may include or may be a part of a dielectric mirror (e.g., a Bragg mirror or a Bragg reflector) or the like having a multi-layered structure of different dielectric materials with different refractive indices to reflect the second target spectrum L2 of the external light LE. For example, in some embodiments, the reflective layer 322 may include a first dielectric material having a first refractive index, and a filler layer 324 between the reflective layer 322 and the absorption layer 326 may include a second dielectric material having a second refractive index different from that of the first refractive index to form the dielectric mirror together with the reflective layer 322, but the present disclosure is not limited thereto.

In some embodiments, as shown in FIG. 3, the reflective layer 322 may be inclined (e.g., may be tilted) at a suitable angle to deflect the second target spectrum L2 of the external light LE toward the metastructure 332. For example, in some embodiments, the reflective layer 322 may be formed by etching a portion of a top surface of the substrate 320 to have an inclined surface, and the reflective material or the dielectric material of the reflective layer 322 may be disposed on the inclined surface. In some embodiments, the filler layer 324 may be formed on the reflective layer 322 to planarize or substantially planarize the top surface of the substrate 320. In this case, the filler layer 324 may include the same reflective material as that of the reflective layer 322, may include a different dielectric material having a different refractive index from that of the reflective layer 322, may include the same or substantially the same material as that of the absorption layer 326, may include the same or substantially the same material as that of the substrate 320, or may include any suitable material known to those skilled in the art to planarize or substantially planarize the top surface of the substrate 320.

While FIG. 3 shows that the reflective layer 322 is inclined to deflect the second target spectrum L2 toward the metastructure 332, the present disclosure is not limited thereto. For example, as described in more detail below with reference to FIGS. 4-7, in some embodiments, the reflective layer 322 may include a metastructure or a metasurface of nanostructures (e.g., a second metastructure) to deflect at least the second target spectrum L2 of the external light LE toward the metastructure 332 (e.g., the first metastructure). In this case, the reflective layer 322 may or may not be inclined according to a configuration of the metastructure (e.g., the second metastructure) formed thereon.

The metastructure 332 (e.g., the first metastructure) may collimate (e.g., may focus or bend) the deflected second target spectrum L2 of the external light LE to the second image sensor 314. For example, the metastructure 332 may include a plurality of nanostructures formed of a suitable transparent material to transmit the second target spectrum L2 of the external light LE that has been deflected from the reflective layer 322, and to collimate (e.g., to focus or bend) the second target spectrum L2 of the external light LE propagating therethrough onto the second image sensor 314, for example, by changing (e.g., by shifting) a phase of the relevant wavelengths of the second target spectrum L2 of the external light LE. The transparent material may include, for example, a high-index dielectric material, for example, such as amorphous silicon (a-Si), or any other suitable dielectric material, for example, such as c-Si, p-Si, Ge, GaAs, ZnS, ZnSe, Si$_3$N$_4$, TiO$_2$, HfO$_2$, and/or the like, or a suitable combination thereof, but the present disclosure is not limited thereto.

While FIG. 3 shows that the nanostructures of the metastructure 332 may be formed on a rear surface of the substrate 320 to overlap with the second image sensor 314 (e.g., in the z-direction), the present disclosure is not limited thereto. For example, in another embodiment, the nanostructures of the metastructure 332 may be formed in (e.g., may be etched into) the rear surface of the substrate 332 to overlap with the second image sensor 314. For example, the rear surface of the substrate 332 may be etched to form patterns in the shape of the nanostructures, and the patterns may then be filled with the suitable transparent material of the nanostructures of the metastructure 332. As another example, the nanostructures of the metastructure 332 may first be formed on the rear surface of the substrate 320, and then covered and/or gaps therebetween may be filled with a material of the substrate 320 (or another suitable material). In some embodiments, there may be multiple layers of nanostructures, which may be separated with low refractive dielectric materials.

The nanostructures of the metastructure 332 may include various suitable geometric dimensions and/or arrangements, such that the nanostructures may suitably change (e.g., shift) the phase of the relevant wavelengths of the second target spectrum L2 propagating therethrough to focus the relevant wavelengths onto the second pixels of the second image sensor 314. For example, the nanostructures of the metastructure 332 may each have a cylindrical shape, but the present disclosure is not limited thereto. In other embodiments, the nanostructures may each have any suitable geometric shape, for example, such as a square or rectangular shape, a spherical, ellipsoidal or semi-spherical shape, a cuboid shape, a cone shape, a prism shape, a pyramid shape, an irregular shape, and/or the like, and may have the same shape as each other or different shapes from one another. Further, the nanostructures of the metastructure 332 may have the same or substantially the same size (e.g., widths, heights, and/or the like) as each other, or may have various different sizes from one another.

Accordingly, in one or more embodiments of the present disclosure, the second target spectrum L2 of the external light LE may be reflected from the optical layer 330 toward the reflective layer 322, may be deflected by the reflective layer 322 toward the metastructure 332, and may be transmitted through the metastructure 332 and collimated to the second image sensor 314 to generate the second image. Thus, the second optical path OP2 of the second target spectrum L2 may be defined in a lateral direction (e.g., the y-axis direction or the x-axis direction) with respect to the first optical path OP1, and thus, the track length may be reduced while the same or substantially the same FOV is provided to the first and second image sensors 312 and 314.

Figure 4:
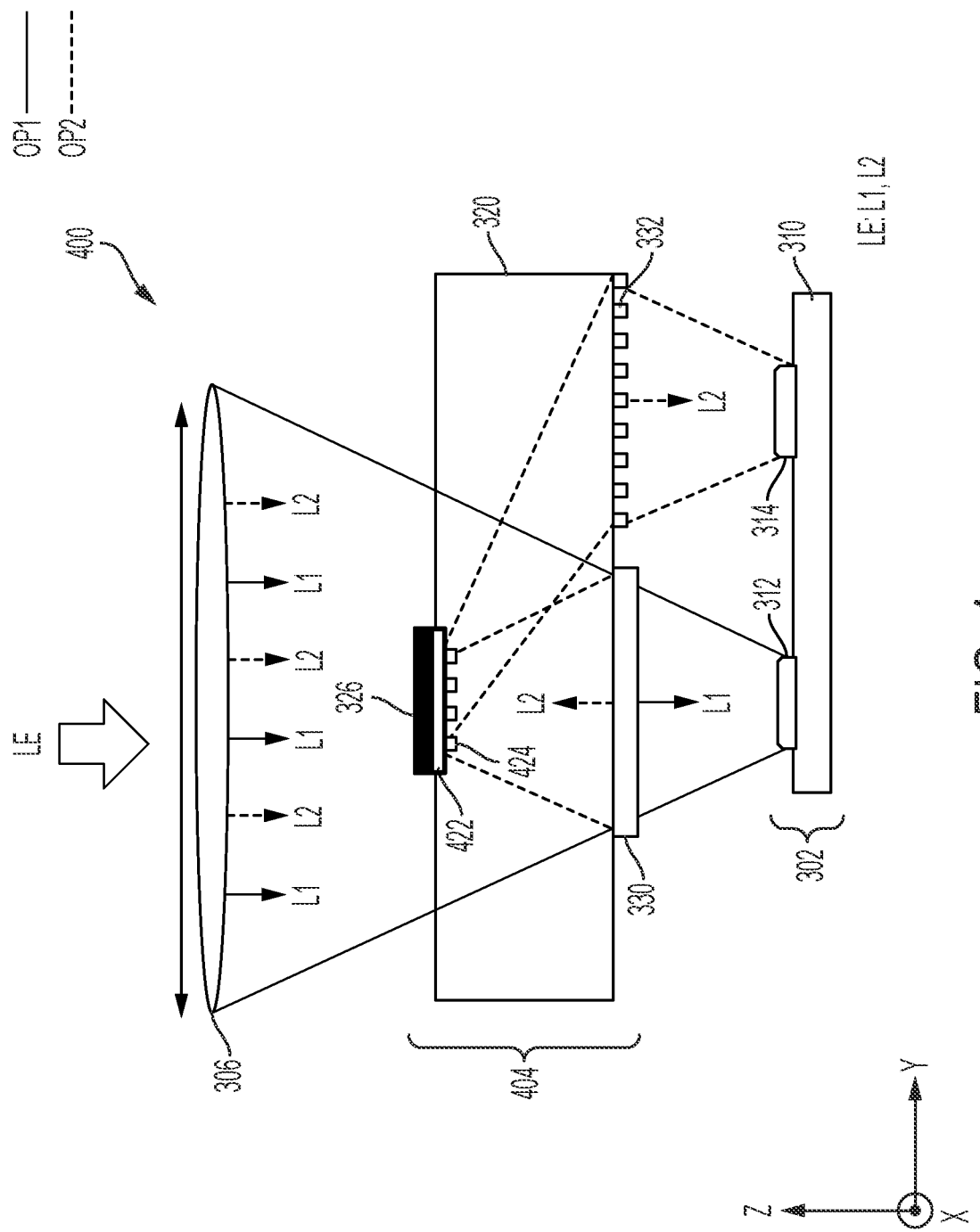
FIG. 4 illustrates a schematic cross-sectional view of a multicamera device according to one or more embodiments of the present disclosure.

FIG. 4 illustrates a schematic cross-sectional view of a multicamera device 400 according to one or more embodiments of the present disclosure. In FIG. 4, the same or substantially the same elements, components, members, and layers as those of the embodiment of FIG. 3 are denoted with the same reference symbols, and thus, redundant description thereof may be simplified or may not be repeated, and the differences therebetween may be mainly described hereinafter.

Referring to FIG. 4, in some embodiments, a folded optic 404 may include the substrate 320, a reflective layer or member (e.g., a first reflective layer or member) 422 on the substrate 320, the absorption layer or member 326 on the reflective layer 422, the optical layer or member 330 between the first image sensor 312 and the substrate 320, and the first metastructure 332 between the second image sensor 314 and the substrate 320. Compared to the optic 304 of the embodiment of FIG. 3, the reflective layer 422 may not be inclined, and may include a second metastructure or metasurface of nanostructures 424 at (e.g., in or on) a surface (e.g., a rear surface) thereof. The optical layer 330, the reflective layer 422, the second metastructure 424, and the absorption layer 326 may be located in the first optical path OP1 to overlap with the first image sensor 312 (e.g., in the z-direction). The first metastructure 332 may overlap with the second image sensor 314, and may be offset (e.g., in the y-direction or the x-direction) from the first optical path OP1. Thus, the first metastructure 332 may be offset from (e.g., in the y-direction or the x-direction) or may not overlap with (e.g., in the z-direction) the optical layer 330, the reflective layer 422, the second metastructure 424, and the absorption layer 326.

The optical layer 330 may transmit the external light LE including at least the first target spectrum L1 through to the first image sensor 312, while reflecting the second target spectrum L2 (e.g., while reflecting only the second target spectrum L2) of the external light LE toward the reflective layer 422. The reflective layer 422 may further reflect the second target spectrum L2 of the external light LE reflected from the optical layer 330. The reflective layer 422 may include a suitable reflective material to reflect the second target spectrum L2 of the external light. For example, in some embodiments, the reflective material may include a highly reflective metal material or other suitable reflective material or coating, such as one or more of those described above with reference to FIG. 3, but the present disclosure is not limited thereto. As another example, in some embodiments, the reflective layer 422 may include a dielectric mirror (e.g., a Bragg mirror or a Bragg reflector) or the like having a multi-layered structure of different dielectric materials with different refractive indices to reflect the second target spectrum L2 of the external light LE.

The second metastructure 424 formed on the reflective layer 422 may deflect the reflected second target spectrum L2 of the external light LE toward the first metastructure 332. For example, the second metastructure 424 may include a plurality of nanostructures formed of a suitable transparent material to transmit the second target spectrum L2 of the external light LE that has been reflected from the reflective layer 422, and to collimate (e.g., to focus or bend) the second target spectrum L2 of the external light LE propagating therethrough toward the first metastructure 332, for example, by changing (e.g., by shifting) a phase of the relevant wavelengths of the second target spectrum L2 of the external light LE. The transparent material may include, for example, a high-index dielectric material, for example, such as amorphous silicon (a-Si), or any other suitable dielectric material, for example, such as c-Si, p-Si, Ge, GaAs, ZnS, ZnSe, $Si_3N_4$, $TiO_2$, $HfO_2$, and/or the like, or a suitable combination thereof, but the present disclosure is not limited thereto. In some embodiments, there may be multiple layers of nanostructures, which may be separated with low refractive dielectric materials. Like the first metastructure 332, the nanostructures of the second metastructure 424 may be formed at (e.g., in or on) a surface of the substrate 320, but at (e.g., in or on) an opposite surface (e.g., a top surface) of the substrate 320 from the surface (e.g., the rear surface) at (e.g., in or on) which the nanostructures of the first metastructure 332 are formed.

The nanostructures of the second metastructure 424 may include various suitable geometric dimensions and/or arrangements, such that the nanostructures may suitably change (e.g., shift) the phase of the relevant wavelengths of the second target spectrum L2 propagating therethrough to bend the relevant wavelengths toward the first metastructure 332. For example, the nanostructures of the second metastructure 424 may each have a cylindrical shape, but the present disclosure is not limited thereto. In other embodiments, the nanostructures may each have any suitable geometric shape, for example, such as a square or rectangular shape, a spherical, ellipsoidal or semi-spherical shape, a cuboid shape, a cone shape, a prism shape, a pyramid shape, an irregular shape, and/or the like, and may have the same shape as each other or different shapes from one another. Further, the nanostructures of the second metastructure 424 may have the same or substantially the same size (e.g., widths, heights, and/or the like) as each other, or may have various different sizes from one another.

The first metastructure 332 may collimate (e.g., may focus or bend) the deflected second target spectrum L2 of the external light LE to the second image sensor 314, such that the second image may be generated. Accordingly, in one or more embodiments of the present disclosure, the second target spectrum L2 of the external light LE may be reflected from the optical layer 330 toward the reflective layer 422, may be further reflected by the reflective layer 422 and deflected by the second metastructure 424 toward the first metastructure 332, and may be transmitted through the first metastructure 332 and collimated to the second image sensor 314 to generate the second image. Thus, the second optical path OP2 of the second target spectrum L2 may be defined in a lateral direction (e.g., the y-axis direction or the x-axis direction) with respect to the first optical path OP1, and thus, the track length may be reduced while providing the same or substantially the same FOV to the first and second image sensors 312 and 314.

Figure 5:
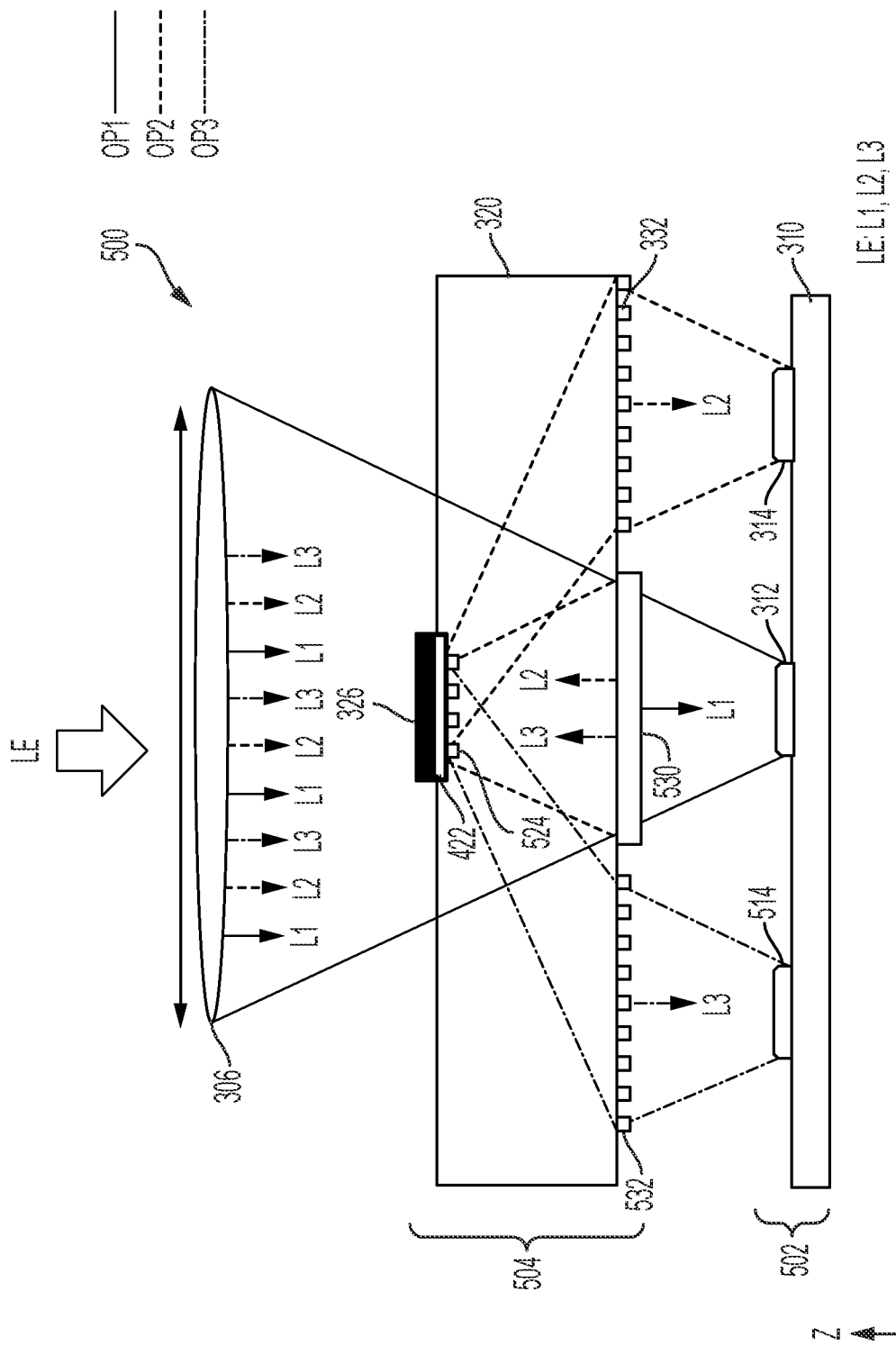
FIG. 5 illustrates a schematic cross-sectional view of a multicamera device according to one or more embodiments of the present disclosure.

FIG. 5 illustrates a schematic cross-sectional view of a multicamera device 500 according to one or more embodiments of the present disclosure. In FIG. 5, the same or substantially the same elements, components, members, and layers as those of one or more embodiments described above are denoted with the same reference symbols, and thus, redundant description thereof may be simplified or may not be repeated, and the differences therebetween may be mainly described hereinafter.

Referring to FIG. 5, in some embodiments, a folded optic 504 may further define a third optical path OP3 (e.g., shown as dashed-dot lines), which may be another secondary optical path for a third target spectrum L3 of the external light LE. As an example, the first target spectrum L1 may include the visible region of the electromagnetic spectrum, the second target spectrum L2 may include at least a portion of the IR region of the electromagnetic spectrum, for example, such as the NIR band of the IR spectrum, and the third target spectrum L3 may include another portion of the IR region of the electromagnetic spectrum, for example, such as the LWIR band of the IR spectrum. As another example, the first target spectrum L1 may include unpolarized light, the second target spectrum L2 may include transverse electric (TE) polarized light, and the third target spectrum L3 may include transverse magnetic (TM) polarized light. However, the present disclosure is not limited thereto, and in other embodiments, the first, second, and third target spectrums L1, L2, and L3 may include any suitable bands of the electromagnetic spectrum that are different from each other. Thus, the first, second, and third target spectrums L1, L2, and L3 of the external light LE may be directed onto various different sensing regions of a sensor chip 502 through the first, second, and third optical paths OP1, OP2, and OP3 respectively.

The sensing regions of the sensor chip 502 may include a first image sensor (e.g., a first camera sensor) 312, a second image sensor (e.g., a second camera sensor) 314, and a third image sensor (e.g., a third camera sensor) 514, which may be spaced apart from each other on the sensor substrate 310. The first, second, and third images sensors 312, 314, and 514 may include the same or different types of sensors (e.g., pixel arrays) to detect the first, second, and third target spectrums L1, L2, and L3 in order to generate a first image, a second image, and a third image, respectively.

In some embodiments, the optic 504 may include the substrate 320, the reflective layer or member (e.g., a first reflective layer or member) 422 on the substrate 320, the absorption layer or member 326 on the reflective layer 422, an optical layer or member 530 between the first image sensor 312 and the substrate 320, the first metastructure 332 between the second image sensor 314 and the substrate 320, a second metastructure 524 at (e.g., in or on) a surface (e.g., a rear surface) of the reflective layer 422, and a third metastructure 532 between the third image sensor 514 and the substrate 320. The optical layer 530, the reflective layer 422, the second metastructure 524, and the absorption layer 326 may be located in the first optical path OP1 to overlap with the first image sensor 312 (e.g., in the z-direction). The first metastructure 332 may overlap with the second image sensor 314, and may be offset (e.g., in the y-direction or the x-direction) from the first optical path OP1. The third metastructure 532 may overlap with the third image sensor 514, and may be offset (e.g., in the y-direction or the x-direction) from the first optical path OP1. Thus, the first and third metastructures 332 and 532 may each be offset from (e.g., in the y-direction or the x-direction) or may not overlap with (e.g., in the z-direction) the optical layer 530, the reflective layer 422, the second metastructure 524, and the absorption layer 326.

As shown in FIG. 5, the first image sensor 312 may be located at the focal distance (e.g., the focal point) of the lens 306, and the second and third image sensors 314 and 514 may be offset from the focal distance, but located at (e.g., in or on) a same plane (e.g., a same surface of the sensor substrate 310) as that of the first image sensor 312. Accordingly, the lens 306 may define the first optical path OP1 by focusing the external light LE through the optic 504 toward the first image sensor 312, and the optical layer 530 may transmit at least the first target spectrum L1 of the external light LE through to the first image sensor 312. The optical layer 530 may reflect the second and third target spectrums L2 and L3 of the external light LE toward the reflection layer 422, and the second metastructure 524 may include a plurality of nanostructures to deflect the second and third target spectrums L2 and L3 in different offset directions (e.g., the y-direction or the x-direction) toward the first and third metastructures 332 and 532, respectively. The first and third metastructures 332 and 532 may each include a plurality of nanostructures to collimate (e.g., to focus) the deflected second and third target spectrums L2 and L3 onto the second and third image sensors 314 and 514, respectively.

Thus, the optic 504 may provide the second and third optical paths OP2 and OP3 for the second and third target spectrums L2 and L3 in the offset directions (e.g., in lateral directions). As the optic 504 respectively defines the second and third optical paths OP2 and OP3 of the second and third target spectrums L2 and L3 toward the second and third image sensors 314 and 514 in the offset directions, respectively, lengths of the second and third optical paths OP2 and OP3 may be increased in the offset directions, while the track length (e.g., the distance between the image sensor and a top surface of the lens 306 in the z-direction) may be decreased. Accordingly, the thickness (e.g., in the z-direction) of the multicamera device 500 may be reduced, and the aesthetics of the multicamera device 500 may be improved, while the first, second, and third image sensors 312, 314, and 514 have the same or substantially the same FOV as each other.

Figure 6:
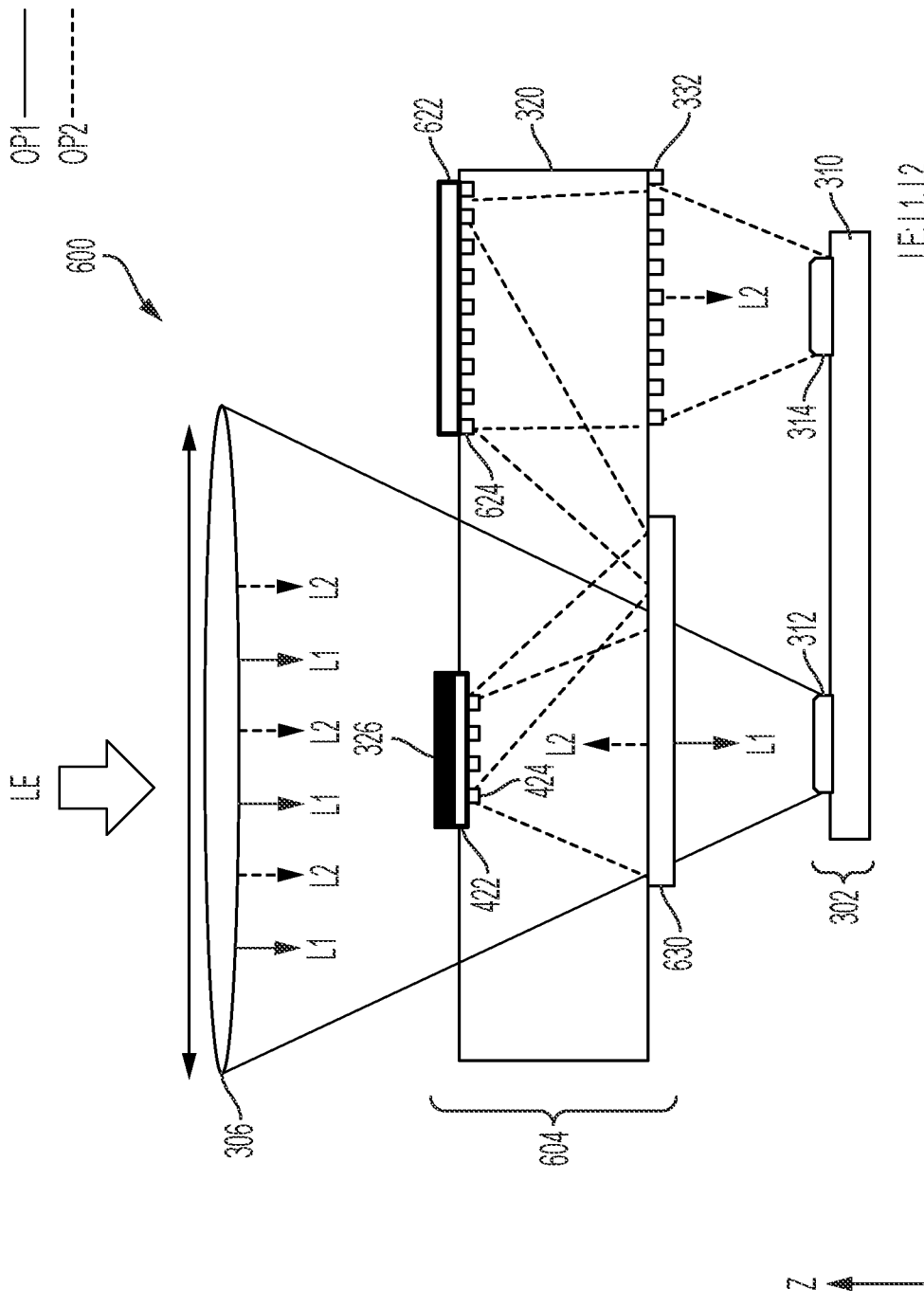
FIG. 6 illustrates a schematic cross-sectional view of a multicamera device according to one or more embodiments of the present disclosure.
Figure 7:
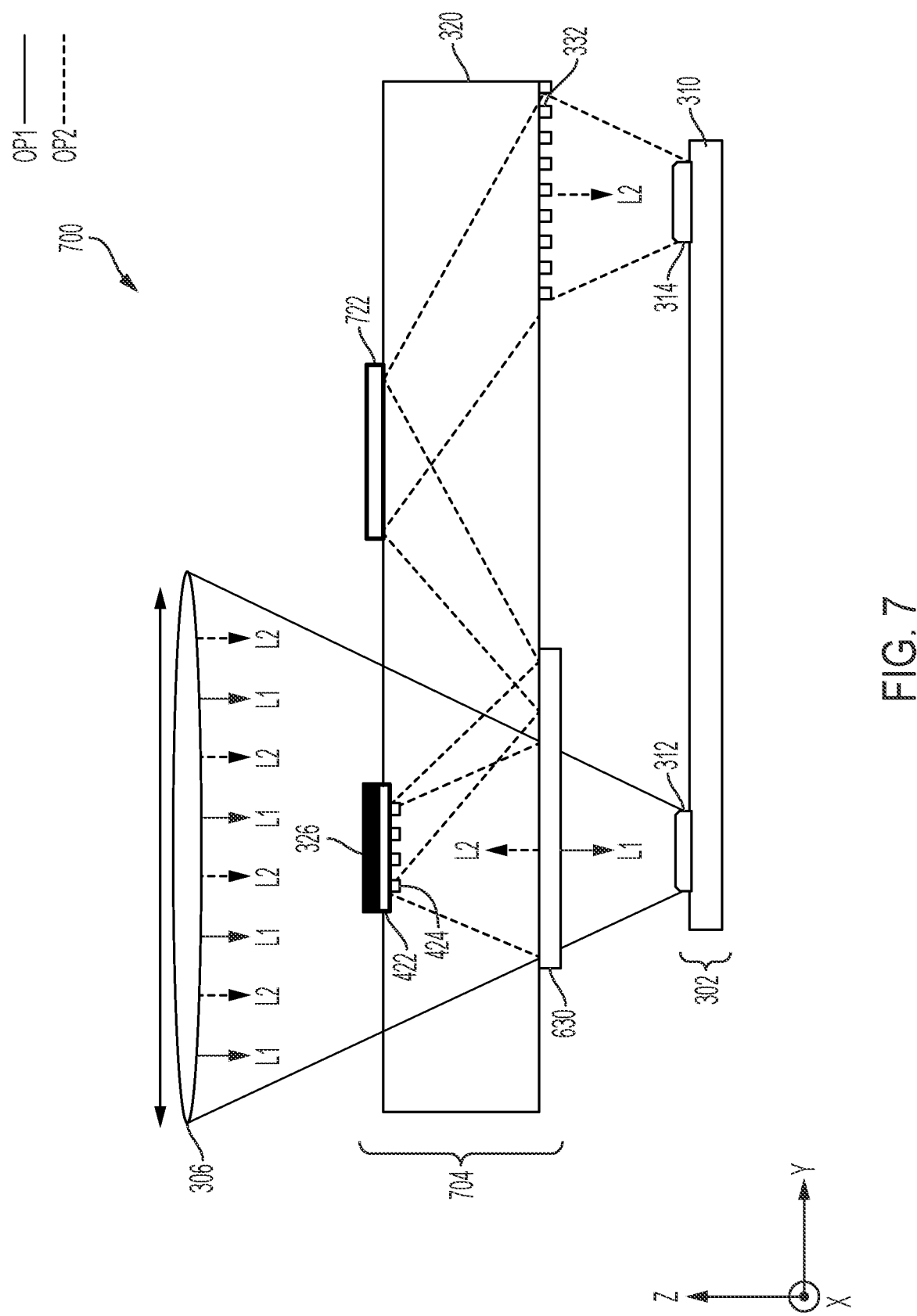
FIG. 7 illustrates a schematic cross-sectional view of a multicamera device according to one or more embodiments of the present disclosure.

FIG. 6 illustrates a schematic cross-sectional view of a multicamera device 600 according to one or more embodiments of the present disclosure. FIG. 7 illustrates a schematic cross-sectional view of a multicamera device 700 according to one or more embodiments of the present disclosure. In FIGS. 6 and 7, the same or substantially the same elements, components, members, and layers as those of one or more embodiments described above are denoted with the same reference symbols, and thus, redundant description thereof may be simplified or may not be repeated, and the differences therebetween may be mainly described hereinafter.

Referring to FIGS. 6 and 7, bending the second target spectrum L2 of the external light LE at a high angle may lower efficiencies, and thus, in some embodiments, the second target spectrum L2 of the external light may be bent at a lower angle to increase efficiencies. For example, using the second metastructure 424 to bend the light at a high angle (e.g., greater than or equal to 50°) towards the first metastructure 322 may result in some loss of light. Further, because a multicamera device may have more room in a lateral direction (e.g., the y-direction or the x-direction) than in the thickness direction (e.g., the z-direction), a length of the second optical path OP2 in the lateral direction (e.g., the y-direction or the x-direction) may be increased and a distance between the first and second image sensors 312 and 314 in the lateral direction may be increased. In this case, the space between the first and second image sensors 312 and 314 of the sensor substrate 310 may be used for other electronic components and the like, for example, such as drivers, processors, logic devices, light emitters, and/or the like.

For example, referring to FIG. 6, in some embodiments, a folded optic 604 may include the substrate 320, the first reflective layer or member 422 on the substrate 320, the absorption layer or member 326 on the first reflective layer 422, an optical layer or member 630 between the first image sensor 312 and the substrate 320, the first metastructure 332 between the second image sensor 314 and the substrate 320, and a second reflective layer or member 622 on the substrate 320 to overlap with the first metastructure 332 (e.g., in the z-direction). In some embodiments, the first reflective layer 422 may further include the second metastructure 424 on a surface thereof to deflect the second target spectrum L2 reflected by the optical layer 630, but the present disclosure is not limited thereto. For example, in other embodiments, the first reflective layer 422 may be inclined at a suitable angle, for example, similar to the reflective layer 322 shown in the embodiment of FIG. 3, to deflect the second target spectrum L2 reflected by the optical layer 630, and in this case, the second metastructure 424 may be omitted.

In some embodiments, the optical layer 630 may be the same or substantially the same as the optical layer 330 described with reference to FIGS. 3 and 4 above, except that a size (e.g., a width) of the optical layer 630 may be increased, such that a portion of the optical layer 630 may be extended outside of the first optical path OP1 toward the first metastructure 332. In this case, the reflective layer 422 and/or the second metastructure 424 may deflect the second target spectrum L2 reflected by the optical layer 630 toward the extended portion of the optical layer 630, and the extended portion of the optical layer 620 may further reflect the second target spectrum L2 toward the second reflective layer 622.

The second reflective layer 622 may include the same or substantially the same reflective material or multi-layered structure of dielectric materials as that of the first reflective layer 422 described above, and may include a fourth metastructure or metasurface of nanostructures 624 on a surface (e.g., a rear surface) thereof configured to collimate (e.g., focus or bend) the second target spectrum L2 reflected by the extended portion of the optical layer 630 on the first metastructure 332. The first metastructure 332 may further collimate (e.g., focus or bend) the second target spectrum L2 onto the second image sensor 314, such that the second image may be generated. For example, in some embodiments, the second target spectrum L2 collimated by the fourth metastructure 624 may diverge or may not converge as desired or expected as it propagates through the substrate 320. In this case, the first metastructure 332 may be included to further collimate (e.g., focus) the diverged light onto the second target spectrum L2. However, the present disclosure is not limited thereto, and in other embodiments, the first metastructure 332 may be omitted, and the fourth metastructure 624 may collimate the second target spectrum L2 onto the second image sensor 314.

Accordingly, in one or more embodiments of the present disclosure, the second target spectrum L2 of the external light LE may be reflected from the optical layer 630 toward the reflective layer 422, may be deflected by the reflective layer 422 and/or the second metastructure 424 toward the extended portion of the optical layer 630, may be further reflected by the extended portion of the optical layer 630 toward the second reflection layer 622, may be collimated by the fourth metastructure 624 onto the first metastructure 332, and may be transmitted through the first metastructure 332 and collimated to the second image sensor 314 to generate the second image. Thus, the second optical path OP2 of the second target spectrum L2 may be extended in a lateral direction (e.g., the y-axis direction or the x-axis direction) with respect to the first optical path OP1, and thus, the track length may be reduced while providing the same or substantially the same FOV to the first and second image sensors 312 and 314.

Referring to FIG. 7, in some embodiments, the second optical path OP2 may be further extended in the lateral direction (e.g., the y-axis direction or the x-axis direction). For example, in some embodiments, a folded optic 704 may include the substrate 320, the first reflective layer or member 422 on the substrate 320, the absorption layer or member 326 on the first reflective layer 422, the optical layer or member 630 between the first image sensor 312 and the substrate 320 and including the extend portion, the first metastructure 332 between the second image sensor 314 and the substrate 320, and a second reflective layer or member 722 on the substrate 320. In some embodiments, the first reflective layer 422 may further include the second metastructure 424 on a surface thereof to deflect the second target spectrum L2 reflected by the optical layer 630 towards the extended portion of the optical layer 630, but the present disclosure is not limited thereto. For example, in other embodiments, the first reflective layer 422 may be inclined at a suitable angle, for example, similar to the reflective layer 322 shown in the embodiment of FIG. 3, to deflect the second target spectrum L2 reflected by the optical layer 630 toward the extended portion of the optical layer 630, and in this case, the second metastructure 424 may be omitted.

In some embodiments, the second reflective layer 722 may include the same or substantially the same reflective material or multi-layered structure of dielectric materials as that of the first reflective layer 422 described above, and may be offset from (e.g., in the y-direction or the z-direction) the first metastructure 332. In other words, unlike the second reflective layer 622 of FIG. 6, the second reflective layer 722 may not overlap with the first metastructure 332, and thus, the second optical path OP2 may be further extended in the lateral direction (e.g., the y-direction or the x-direction) such that a space between the first and second image sensors 312 and 314 may be further increased. For example, in some embodiments, the second reflective layer 722 may be between the extended portion of the optical layer 630 and the first metastructure 332 in a plan view (e.g., a view from a direction that is perpendicular to or substantially perpendicular to a top surface of the relevant element or layer). In some embodiments, the second reflective layer 722 may be spaced apart from the extended portion of the optical layer 630 and the first metastructure 332 in the plan view. In another embodiment, the second reflective layer 722 may partially overlap with at least one of the extended portion of the optical layer 630 or the first metastructure 332 in the plan view.

As shown in FIG. 7, unlike the second reflective layer 622 of FIG. 6, the second reflective layer 722 may not include a metastructure on a surface thereof, and instead, may reflect the second target spectrum L2 toward the first metastructure 332 according to an angle of the incident light coming from the extended portion of the optical layer, and the offset distance of the first metastructure 332 from the second reflective layer 662. However, the present disclosure is not limited thereto, and in other embodiments, the second reflective layer 722 may further include the metastructure on the surface thereof to control the bending angle of the second target spectrum L2 as needed or desired.

Accordingly, in one or more embodiments of the present disclosure, the second target spectrum L2 of the external light LE may be reflected from the optical layer 630 toward the reflective layer 422, may be deflected by the reflective layer 422 and/or the second metastructure 424 toward the extended portion of the optical layer 630, may be further reflected by the extended portion of the optical layer 630 toward the second reflection layer 722, may be reflected by the second reflection layer 722 toward the first metastructure 332 in the offset direction (e.g., the y-direction or x-direction), and may be transmitted through the first metastructure 332 and collimated to the second image sensor 314 to generate the second image. Thus, the second optical path OP2 of the second target spectrum L2 may be further extended in a lateral direction (e.g., the y-axis direction or the x-axis direction) with respect to the first optical path OP1, and thus, the track length may be reduced while providing the same or substantially the same FOV to the first and second image sensors 312 and 314.

Figure 8:
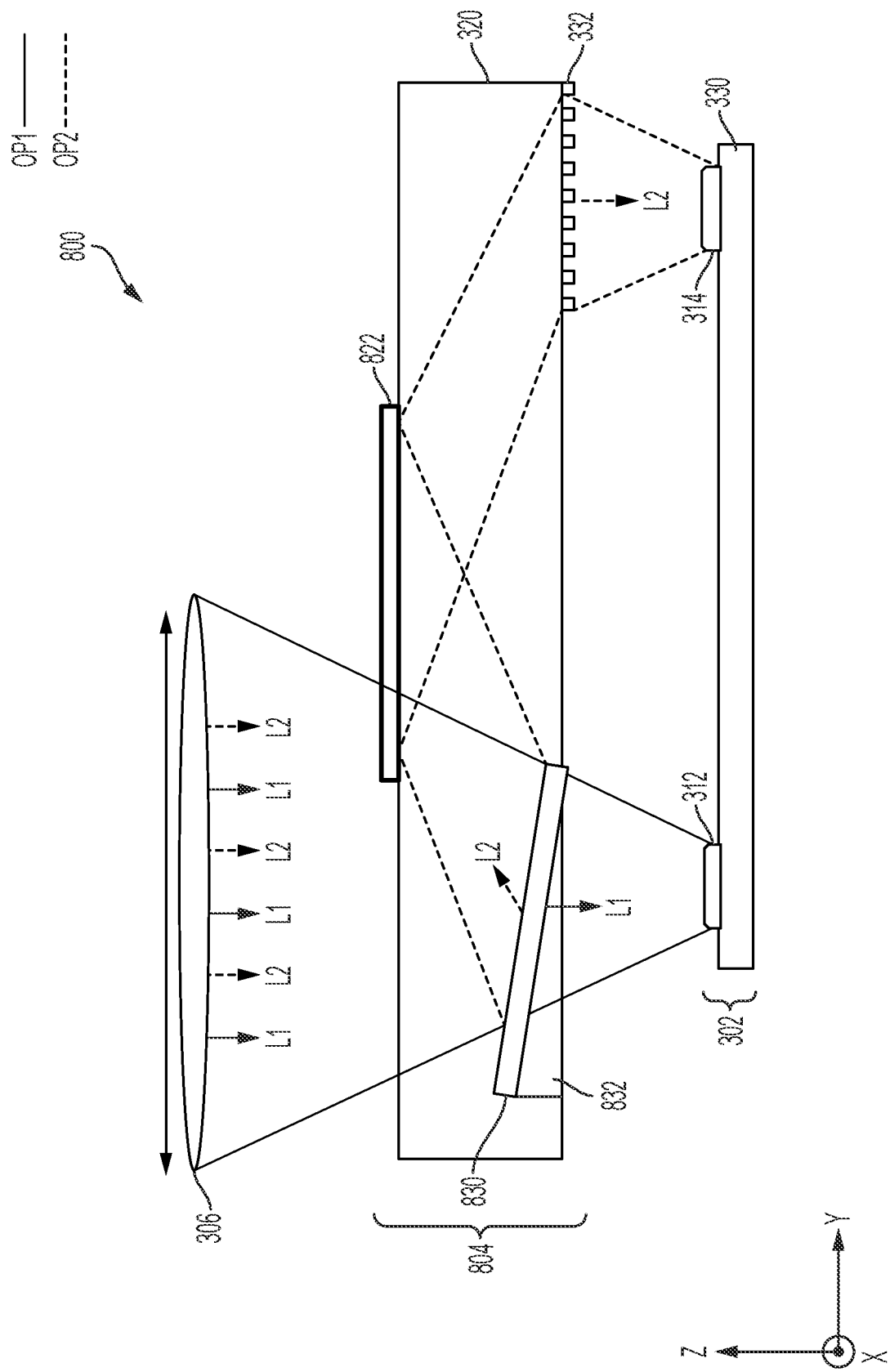
FIG. 8 illustrates a schematic cross-sectional view of a multicamera device according to one or more embodiments of the present disclosure.

FIG. 8 illustrates a schematic cross-sectional view of a multicamera device 800 according to one or more embodiments of the present disclosure. In FIG. 8, the same or substantially the same elements, components, members, and layers as those of one or more embodiments described above are denoted with the same reference symbols, and thus, redundant description thereof may be simplified or may not be repeated, and the differences therebetween may be mainly described hereinafter.

Referring to FIG. 8, for example, in some embodiments, the optical layer 830 may be formed by etching a portion of a bottom surface of the substrate 320 to have an inclined surface, and the dielectric materials of the optical layer 330 may be disposed on the inclined surface. In some embodiments, a filler layer 832 may be formed on the optical layer 830 to planarize or substantially planarize the bottom surface of the substrate 320. In this case, the filler layer 832 may include one or more of the same dielectric materials as that of the optical layer 830, may include the same or substantially the same material as that of the substrate 320, or may include any suitable material known to those skilled in the art to planarize or substantially planarize the bottom surface of the substrate 320.

In some embodiments, because the optical layer 830 may be inclined, a first reflective layer or member 822 may be offset from (e.g., in the y-direction or the z-direction) the optical layer 830 towards the first metastructure 332 in a plan view (e.g., a view from a direction that is perpendicular to or substantially perpendicular to a top surface of the relevant element or layer). For example, the first reflective layer 822 may be the same or substantially the same as the second reflective layer 722 (e.g., shown in FIG. 7), such that the first reflective layer 822 may be between the optical layer 830 and the first metastructure 332 in the plan view. In some embodiments, the first reflective layer 822 may be spaced apart from the optical layer 830 and the first metastructure 332 in the plan view. In another embodiment, the first reflective layer 822 may partially overlap with at least one of the optical layer 830 or the first metastructure 332 in the plan view. The optical layer 830 may reflect the second target spectrum L2 in an offset direction towards the first reflective layer 822 according to an inclined angle of the optical layer 830, and the first reflective layer 822 may reflect the second target spectrum L2 towards the first metastructure 332.

Accordingly, in some embodiments, the second target spectrum L2 of the external light LE may be reflected from the optical layer 830 toward the first reflective layer 822 based on an inclined angle of the optical layer 830, may be reflected by the first reflective layer 822 toward the first metastructure 332 in the offset direction (e.g., the y-direction or x-direction), and may be transmitted through the first metastructure 332 and collimated to the second image sensor 314 to generate the second image. Thus, the second optical path OP2 of the second target spectrum L2 may be further extended in a lateral direction (e.g., the y-axis direction or the x-axis direction) with respect to the first optical path OP1, and thus, the track length may be reduced while providing the same or substantially the same FOV to the first and second image sensors 312 and 314.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A multicamera device comprising:
   a first sensor configured to detect a first spectrum of external light;
   a second sensor offset from the first sensor in an offset direction, and configured to detect a second spectrum of the external light; and
   an optic overlapping with the first and second sensors in a thickness direction crossing the offset direction, and configured to:
   transmit the first spectrum of the external light in the thickness direction to the first sensor; and
   reflect the second spectrum of the external light in the offset direction towards the second sensor.

2. The device of claim 1, wherein the optic comprises:
   a substrate;
   a first reflective layer on the substrate; and
   an optical layer between the first sensor and the substrate.

3. The device of claim 2, wherein the substrate, the first reflective layer, and the optical layer overlap with the first sensor in the thickness direction, and
   wherein the first reflective layer and the optical layer are offset from the second sensor in the offset direction.

4. The device of claim 1, wherein the optic comprises a first reflective layer and an optical layer, the optical layer being configured to transmit the first spectrum of the external light to the first sensor, and reflect the second spectrum of the external light towards the first reflective layer.

5. The device of claim 4, wherein the first reflective layer is configured to reflect the second spectrum of the external light in the offset direction towards the second sensor.

6. The device of claim 5, wherein the first reflective layer is inclined to reflect the second spectrum towards the offset direction.

7. The device of claim 1, wherein the optic comprises a first metastructure overlapping with the second sensor, and configured to collimate the second spectrum of the external light on the second sensor.

8. The device of claim 7, wherein the optic further comprises a second metastructure overlapping with the first sensor, and configured to collimate the second spectrum of the external light onto the first metastructure.

9. The device of claim 1, wherein:
   the optic comprises a first reflective layer, a second reflective layer, and an optical layer;

the first reflective layer is configured to reflect the second spectrum toward an end of the optical layer;
the end of the optical layer is configured to reflect the second spectrum toward the second reflective layer; and
the second reflective layer is configured to reflect the second spectrum in a direction towards the second sensor.

10. The device of claim 1, further comprising:
a lens on the optic, and configured to transmit the external light through, and focus the external light on the first sensor through the optic.

11. An optic for a multicamera device comprising a first sensor configured to detect a first spectrum of external light, and a second sensor offset from the first sensor in an offset direction and configured to detect a second spectrum of the external light, the optic comprising:
a substrate overlapping with the first and second sensors in a thickness direction crossing the offset direction;
a first reflective layer on the substrate; and
an optical layer between the first sensor and the substrate, wherein the optic is configured to:
transmit the first spectrum of the external light in the thickness direction to the first sensor; and
reflect the second spectrum of the external light in the offset direction towards the second sensor.

12. The optic of claim 11, wherein the substrate, the first reflective layer, and the optical layer overlap with the first sensor in the thickness direction, and
wherein the first reflective layer and the optical layer are offset from the second sensor in the offset direction.

13. The optic of claim 11, further comprising a first metastructure overlapping with the second sensor, and configured to collimate the second spectrum of the external light on the second sensor.

14. The optic of claim 13, further comprising a second metastructure overlapping with the first sensor, and configured to collimate the second spectrum of the external light onto the first metastructure.

15. The optic of claim 11, wherein:
the optic further comprises a second reflective layer;
the first reflective layer is configured to reflect the second spectrum toward an end of the optical layer;
the end of the optical layer is configured to reflect the second spectrum toward the second reflective layer; and
the second reflective layer is configured to reflect the second spectrum in a direction towards the second sensor.

16. The optic of claim 11, wherein the first reflective layer is inclined to reflect the second spectrum in the offset direction towards the second sensor.

17. A multicamera device comprising:
a first sensor configured to detect a first spectrum of external light;
a second sensor configured to detect a second spectrum of the external light, and located along a first direction with respect to the first sensor;
a lens overlapping with the first sensor, and defining a first optical path for the external light toward the first sensor in a second direction crossing the first direction; and
an optic between the lens and the first and second sensors, and defining a second optical path for the second spectrum of the external light towards the second sensor in the first direction.

18. The device of claim 17, wherein the optic comprises:
a substrate;
a reflective layer on a first surface of the substrate; and
an optical layer on a second surface of the substrate opposite the first surface.

19. The device of claim 18, wherein the substrate, the first reflective layer, and the optical layer overlap with the first sensor in the second direction, and
wherein the first reflective layer and the optical layer are offset from the second sensor in the first direction.

20. The device of claim 17, wherein the optic is configured to:
transmit the first spectrum of the external light in the second direction to the first sensor; and
reflect the second spectrum of the external light in the first direction towards the second sensor.

* * * * *